(12) United States Patent
Chen (10) Patent No.: US 7,891,837 B2
(45) Date of Patent: Feb. 22, 2011

(54) SYSTEM IN PACKAGE HIGH POWER HIGHLY EFFICIENT DIODE LAMP

(75) Inventor: Jen-Shyan Chen, Hsinchu (TW)

(73) Assignee: Neobulb Technologies, Inc. (BN)

( * ) Notice: Subject to any disclaimer, the term of this patent is extended or adjusted under 35 U.S.C. 154(b) by 455 days.

(21) Appl. No.: 11/887,427

(22) PCT Filed: Mar. 28, 2005

(86) PCT No.: PCT/CN2005/000389

§ 371 (c)(1),
(2), (4) Date: Sep. 28, 2007

(87) PCT Pub. No.: WO2006/102785

PCT Pub. Date: Oct. 5, 2006

(65) Prior Publication Data

US 2009/0278460 A1    Nov. 12, 2009

(51) Int. Cl.
*F21S 4/00*   (2006.01)
*F21V 29/00*  (2006.01)

(52) U.S. Cl. .................................. 362/249.02; 362/294

(58) Field of Classification Search ................. 315/112, 315/113, 312, 324; 362/85, 227, 235, 240, 362/294, 373, 249, 545, 547, 800, 249.01, 362/249.02
See application file for complete search history.

(56) References Cited

U.S. PATENT DOCUMENTS

| | | | |
|---|---|---|---|
| 5,857,767 A * | 1/1999 | Hochstein | ................... 362/294 |
| 6,234,648 B1 * | 5/2001 | Borner et al. | ............... 362/235 |
| 6,465,961 B1 | 10/2002 | Cao | |
| 6,897,486 B2 | 5/2005 | Loh | |

| | | |
|---|---|---|
| 7,083,305 B2 | 8/2006 | Galli |

(Continued)

FOREIGN PATENT DOCUMENTS

CN    1359137 A    12/2001

(Continued)

OTHER PUBLICATIONS

International Search Report for PCT/CN2005/000389 dated Jan. 5, 2006.

(Continued)

*Primary Examiner*—Thuy Vinh Tran
(74) *Attorney, Agent, or Firm*—Thomas, Kayden, Horstemeyer & Risley, LLP.

(57) ABSTRACT

A system in package, high power, and highly efficient diode lamp is provided. The diode lamp includes a heat-conducting/heat-dissipating module, a LED light module, an optical module, and a control circuit module. The heat-conducting/heat-dissipating module includes a heat-conducting device and at least one heat-dissipating fin. The LED light module is disposed on a flat portion of the heat-conducting device. The optical module focuses the light emitted by the LED light module. The control circuit module is used to control the LED light module. When the diode lamp is electrically connected to a power supply, the control circuit module selectively controls the LED light module to emit the light. The heat generated during the operation of the LED light module is conducted from the flat portion of the heat-conducting device to the at least one heat-dissipating fin, and then it is dissipated by the at least one heat-dissipating fin.

19 Claims, 14 Drawing Sheets

U.S. PATENT DOCUMENTS

| | | |
|---|---|---|
| 7,331,691 B2 * | 2/2008 | Livesay et al. ............... 362/294 |
| 7,438,448 B2 * | 10/2008 | Chen .......................... 362/373 |
| 2002/0176250 A1 | 11/2002 | Bohler et al. |
| 2004/0124487 A1 | 7/2004 | Loh |
| 2004/0213016 A1 | 10/2004 | Rice |
| 2004/0256630 A1 * | 12/2004 | Cao ........................... 257/98 |
| 2005/0231983 A1 | 10/2005 | Dahm |
| 2005/0279949 A1 * | 12/2005 | Oldham et al. ........... 250/458.1 |
| 2006/0044804 A1 * | 3/2006 | Ono et al. .................. 362/294 |
| 2006/0092639 A1 | 5/2006 | Livesay et al. |
| 2006/0100496 A1 | 5/2006 | Avron |
| 2007/0273290 A1 * | 11/2007 | Ashdown et al. ............ 315/113 |

FOREIGN PATENT DOCUMENTS

| | | |
|---|---|---|
| CN | 1359137 | 7/2002 |
| CN | 2564849 Y | 8/2002 |
| CN | 2644878 Y | 8/2003 |
| CN | 2677742 Y | 1/2004 |
| TW | 549590 | 10/2002 |

OTHER PUBLICATIONS

English Abstract of CN1359137.

Australian Office Action in related patent application No. 2005329901 dated Jul. 20, 2010.

* cited by examiner

FIG.1 (Prior Arts)

FIG.2 (Prior Arts)

SYSTEM IN PACKAGE HIGH POWER HIGHLY EFFICIENT DIODE LAMP

CROSS REFERENCE TO RELATED APPLICATION

This utility application is a national stage filing under 35 U.S.C. 371 that claims the benefit of and priority to PCT International application PCT/CN2005/000389, filed Mar. 28, 2005, which is incorporated by reference in its entirety herein.

BACKGROUND OF THE INVENTION

1. Field of the Invention

The present invention relates to diode lamps with high power and high efficiency. More specifically, the diode lamps in this invention are system-in-package lighting devices.

2. Description of the Prior Art

Because light-emitting diodes (LEDs) have many advantages, such as low power consumption, quick reaction, being shake-endurable, and being suited to mass production, lighting products that adopts LEDs as light sources are more and more popular. However, after being turned on for a while, the temperature of high power LEDs in prior arts will be too high. The lighting efficiency of LEDs is thus decreased, and their light intensity can not be further increased. Therefore, every product that adopts a high power and highly efficient LED needs good heat-dissipating mechanisms.

Figure 1:
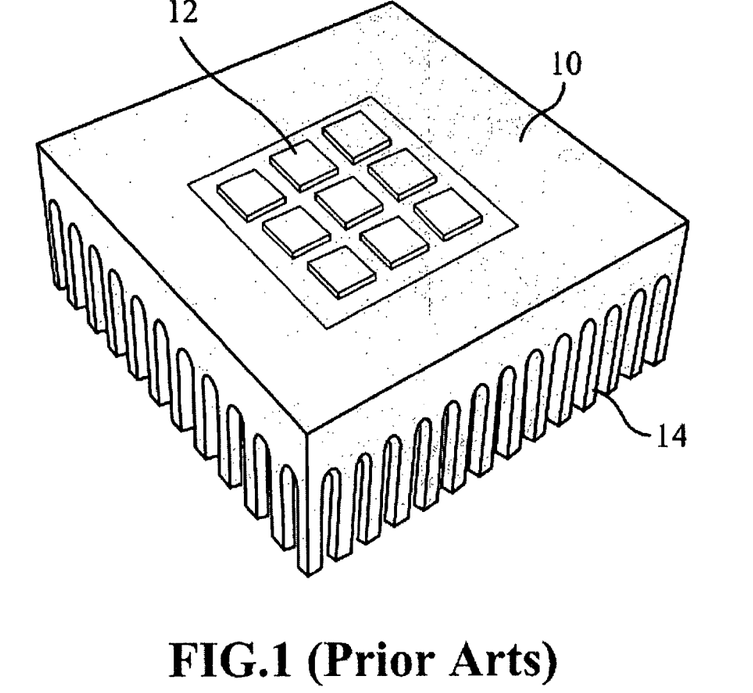
FIG. 1 illustrates a lighting device integrated with a heat-dissipating device in prior arts.

Please refer to FIG. 1, which illustrates a lighting device integrated with a heat-dissipating device in prior arts. To increase the light intensity of one single lighting device, plural LEDs 12 are mounted on the heat-conducting plate 10. Many heat-dissipating fins 14 are disposed around the periphery of the heat-conducting plate 10. Because the distances between the LEDs 12 are too far, this lighting device cannot provide lighting effects similar to those of point light sources.

Figure 2:
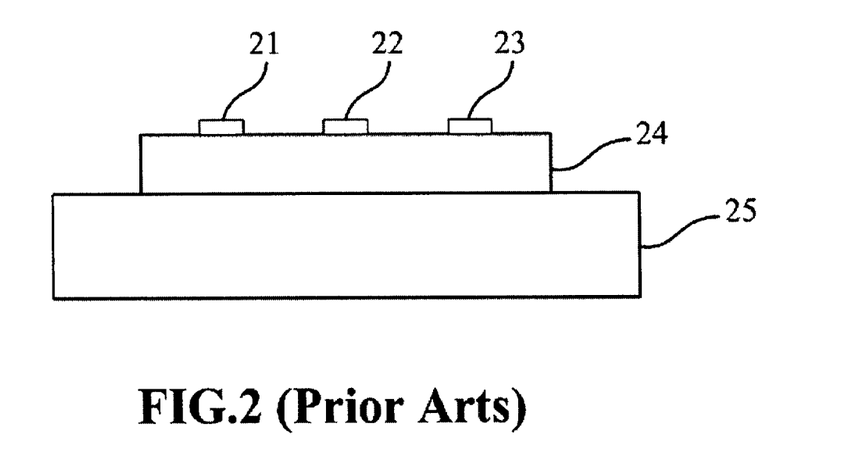
FIG. 2 illustrates a lighting device disclosed in the Taiwanese patent No. 568,358.

Please refer to FIG. 2, which illustrates a lighting device disclosed in the No. 568,358 Taiwanese patent. A red LED 21, a green LED 22, and a blue LED 23 are disposed on a control circuit 24. The control circuit 24 is used for controlling the LEDs. The base 25 under the control circuit 24 helps to dissipate heat for the LEDs and the control circuit 24. The disadvantage of the lighting device shown in FIG. 2 is that the control circuit 24 is too close to the LEDs. When the LEDs generate heat, the operation of the control circuit 24 is easily affected and even damaged.

Accordingly, this invention provides high power and highly efficient diode lamps. More specifically, the diode lamps in this invention are system-in-package lighting devices. The diode lamps according to the present invention not only can effectively solve the heat-dissipating problem in prior arts but can also provide lighting effects equivalent to those of point light sources.

SUMMARY OF THE INVENTION

The first main purpose of this invention is to provide a system-in-package, high power, and highly efficient diode lamp. One preferred embodiment, according to this invention, is a diode lamp which includes a heat-conducting/heat-dissipating module, a LED light module, an optical module, and a control circuit module. The heat-conducting/heat-dissipating module includes a heat-conducting device and at least one heat-dissipating fin. The LED light module is mounted on a flat portion of the heat-conducting device and jointed to the flat portion smoothly and closely. The optical module is used for focusing light emitted by the LED light module. The control circuit module is used for controlling the LED light module. When the diode lamp is electrically connected to a power supply, the control circuit module selectively controls the LED light module to emit light. Heat, generated during the operation of the LED light module, is conducted from the flat portion of the heat-conducting device to the at least one heat-dissipating fin and is dissipated by the at least one heat-dissipating fin.

Because the heat-conducting/heat-dissipating module is integrated with the LED light module in the diode lamp, according to this invention, heat generated by the LED light module can be immediately dissipated into surrounding air by the heat-dissipating fins. Thus, the heat-dissipating efficiency of the diode lamp is greatly raised. Therefore, compared with prior arts, the diode lamp, according to this invention, is more adaptive to lighting devices that requires high power and highly efficient diode lamps.

The second main purpose of this invention is to provide a diode lamp that has lighting effect equivalent to that of a point light source. In the LED light module, according to this invention, plural LEDs or laser diodes can be packaged together. Compared with the concave mirror in the optical module, the volume of the LEDs is considerably small. Thus, lighting effect equivalent to that of a point light source can be provided.

The third main purpose of this invention is to provide a diode lamp that can be extensively integrated to present lighting devices. The diode lamps in the aforementioned embodiments can further include a casing. The casing can be designed to be adapted to present cylindrical or rectangular batteries. Therefore, it is easy to integrate the diode lamp, according to this invention, to current power sources.

The advantage and spirit of the invention may be understood by the following recitations together with the appended drawings.

DETAILED DESCRIPTION OF THE INVENTION

One main purpose of this invention is to provide a system-in-package, high power, and highly efficient diode lamp.

Figure 3A:
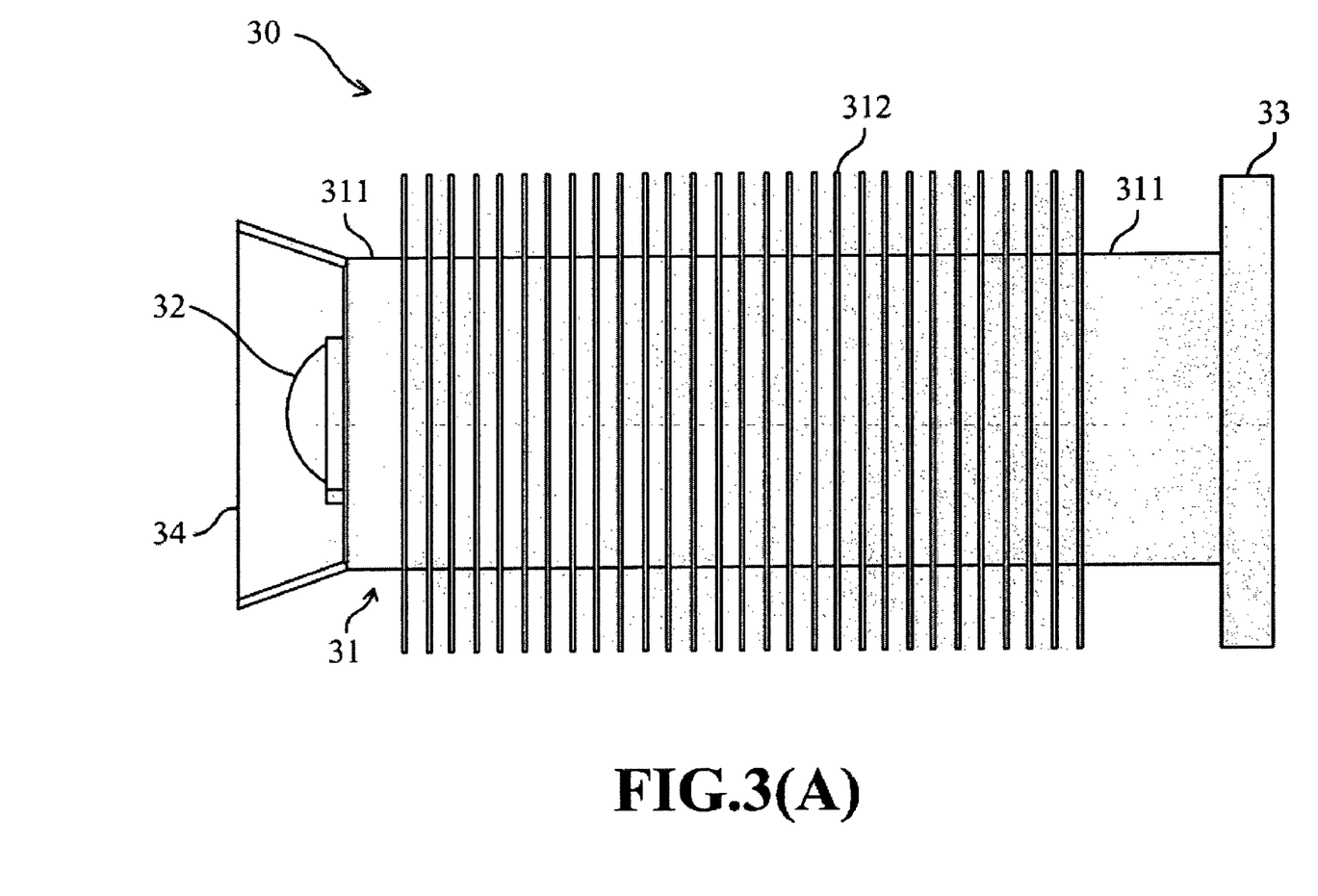
FIG. 3(A) and FIG. 3(B) respectively illustrate the lateral view and three-dimensional view of one preferred embodiment according to this invention.
Figure 3B:
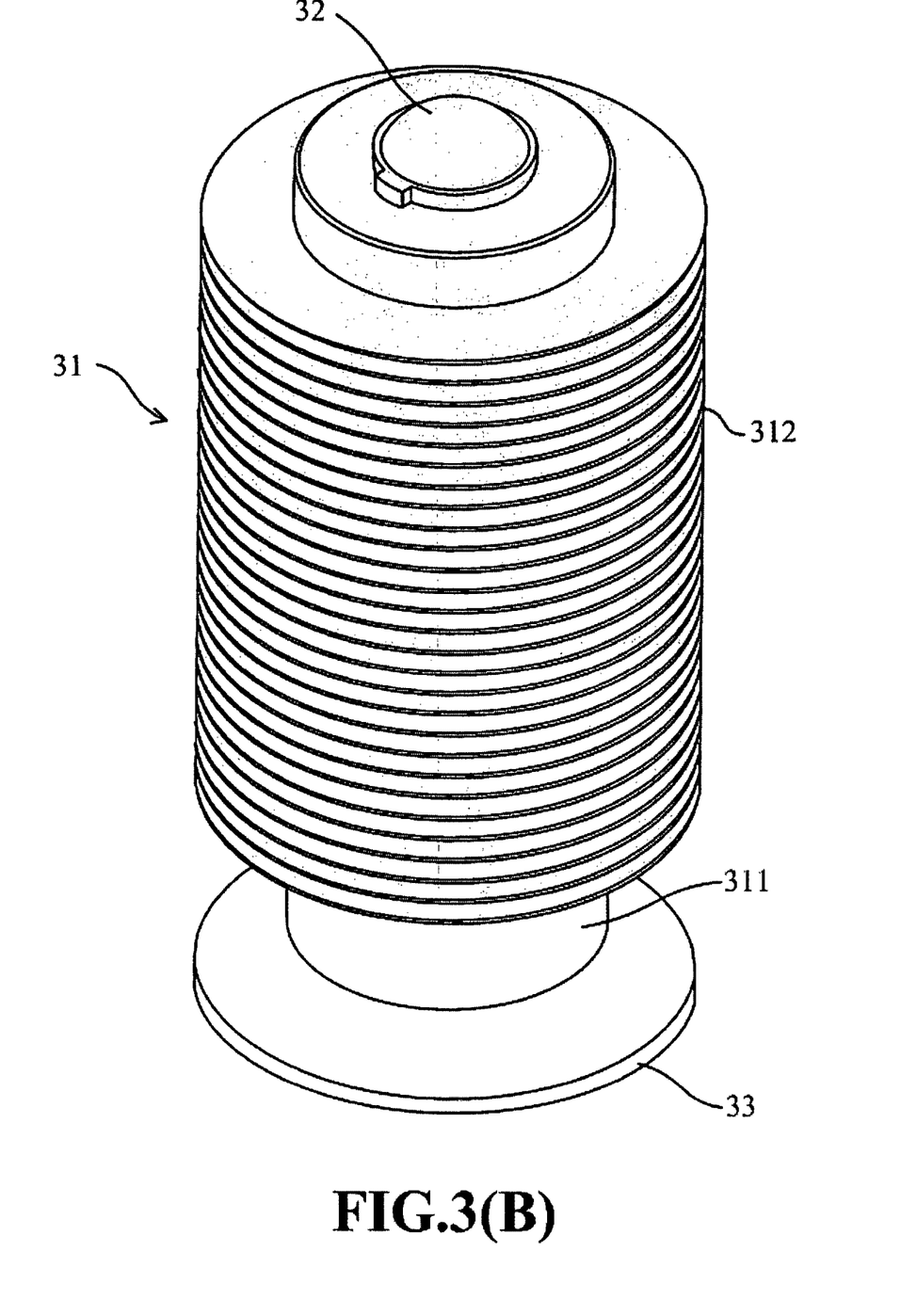

Please refer to FIG. 3(A) and FIG. 3(B), which respectively illustrate the lateral view and three-dimensional view of the diode lamp of one preferred embodiment according to this invention. The diode lamp 30, according to this invention, includes a heat-conducting/heat-dissipating module 31, an LED light module 32, a control circuit module 33, and an optical module 34. The heat-conducting/heat-dissipating module 31 includes a heat-conducting device 311 and at least one heat-dissipating fin 312. The LED light module 32 is mounted on a flat portion of the heat-conducting device 311. The optical module 34 is used for focusing light emitted by the LED light module 32. The control circuit module 33 is used for controlling the LED light module 32. When the diode lamp 30 is electrically connected to a power supply, the control circuit module 33 selectively controls the LED light module 32 to emit light. Heat, generated during the operation of the LED light module 32, is conducted from the flat portion of the heat-conducting device 311 to the at least one heat-dissipating fin 312 and is dissipated by the at least one heat-dissipating fin 312.

As shown in FIG. 3(A) and FIG. 3(B), since there is a distance between the control circuit module 33 and the LED light module 32, this invention can accordingly prevent the control circuit module 33 from being affected by the heat generated by the LED light module 32.

According to this invention, the power source connected to the diode lamp 30 can be either a DC power source or an AC power source. When the power source is an AC power source, the control circuit module 33 can further include an AC-to-DC converter to convert AC currents into DC currents for the diode lamp 30.

Figure 4:
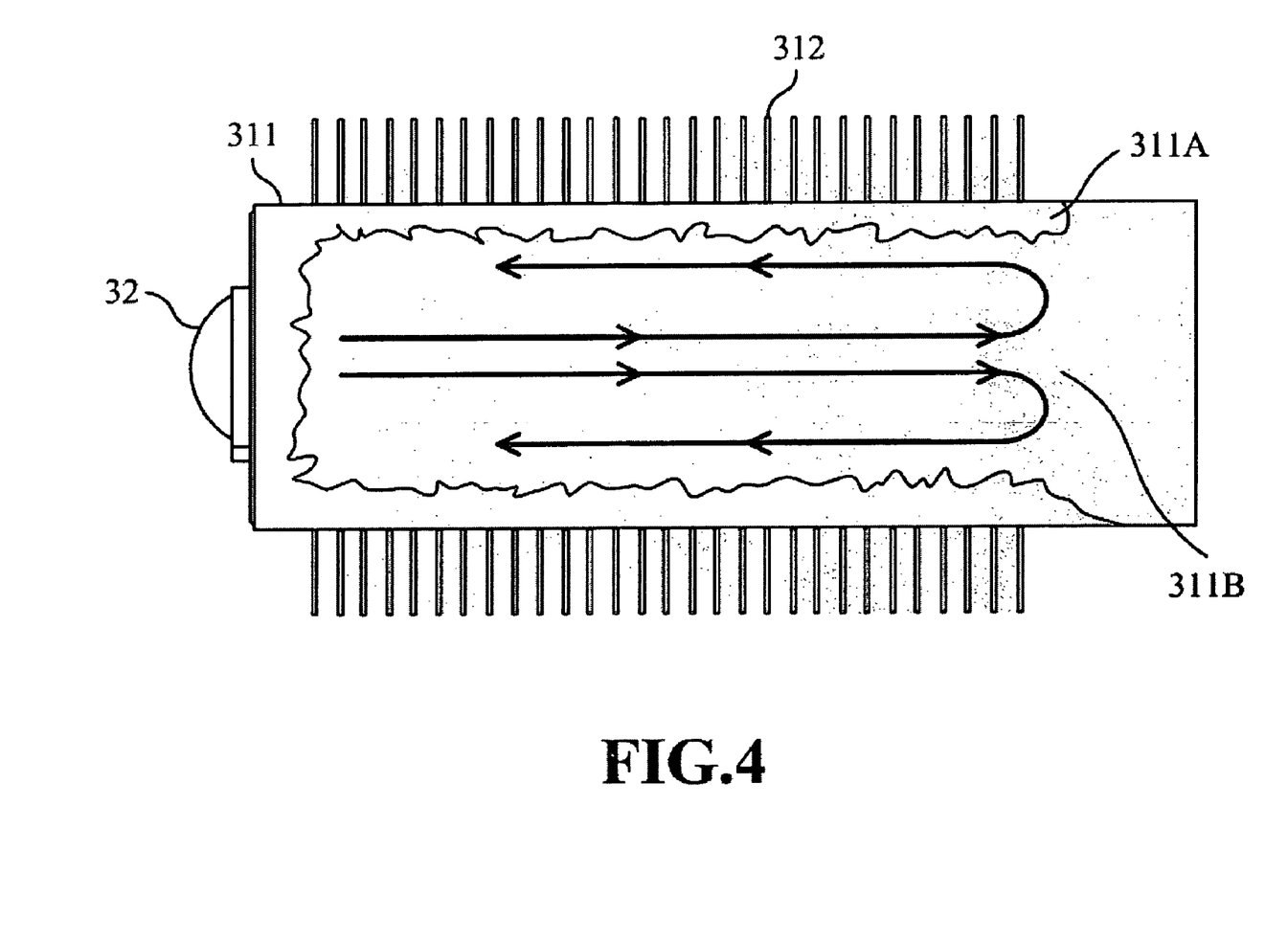
FIG. 4 shows the heat-conducting and heat-dissipating mechanisms in the heat-conducting/heat-dissipating module.

In actual applications, the heat-conducting device 311 can be a heat-conducting pillar or a heat-conducting pipe made of copper. Please refer to FIG. 4, which shows the heat-conducting and heat-dissipating mechanisms in the heat-conducting/heat-dissipating module 31. Inside the heat-conducting/heat-dissipating module 31, capillary tissues 311A and working fluid 311B are included. When the LED light module 32 generates heat, the working fluid 311B closer to the LED light module 32 will be evaporated from liquid into gas. The evaporated fluid 311B can then conduct heat to the other end of the heat-conducting/heat-dissipating module 31. After the heat-dissipating fins 312 dissipate heat, the fluid 311B is accordingly cooled and then condensed into fluid again. The capillary tissues 311A are used for transmitting the condensed fluid 311B back to the end that is closer to the LED light module 32. By the circulating mechanism shown in FIG. 4, heat can be effectively conducted and dissipated.

Figure 5:
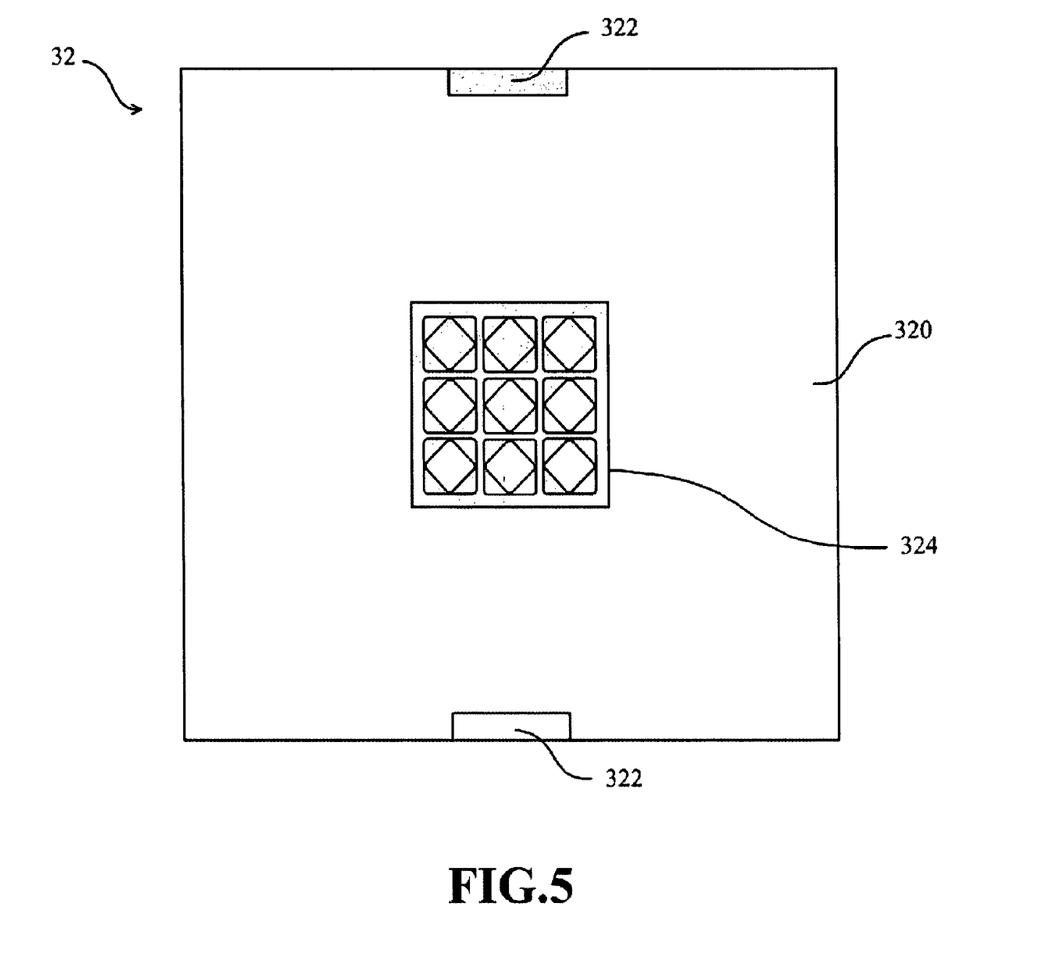
FIG. 5 and FIG. 6 depict implementations of the LED light module.
Figure 6:
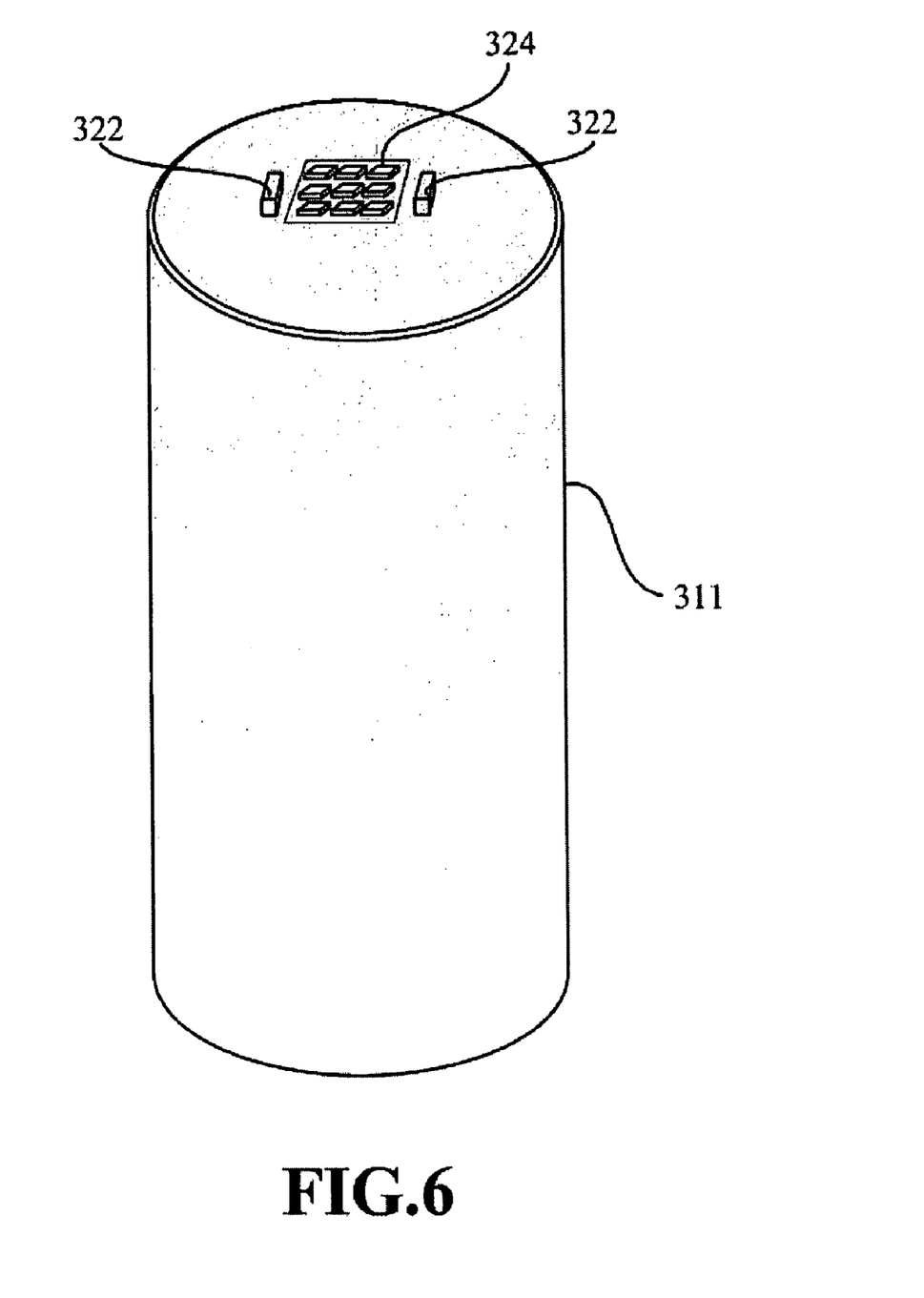

Please refer to FIG. 5. In actual applications, the LED light module 32 can include a substrate 320 formed of a silicon or metal material, two electrodes 322, and a light-emitting module 324. The light-emitting module 324 and the two electrodes 322 are respectively disposed on the substrate 320. The light-emitting module 324 is electrically connected to the control circuit module 33 through the two electrodes 322. Please refer to FIG. 6. As shown in FIG. 6, the light-emitting module 324 and the two electrodes 322 can be directly disposed on the flat portion of the heat-conducting device 311. A respective insulator is disposed between the heat-conducting device 311 and each of the two electrodes 322.

In actual applications, the light-emitting module 324 can include at least one LED or a laser diode. The LED in the light-emitting module 324 may be a white LED or can be composed of a blue LED and phosphors. The light-emitting module 324 can also include at least one red LED, at least one blue LED, and at least one green LED. The control circuit module 33 selectively controls the at least one red LED, the at least one blue LED, and the at least one green LED to emit light. In this way, light of various colors can be generated by mixing light from the LEDs in different ratios.

In the diode lamp 30, according to this invention, plural LEDs can be packaged together. Compared to concave mirrors cooperated with the light-emitting module 324 or the whole diode lamp 30, the volume of the light-emitting module 324 is considerably small. Thus, lighting effects equivalent to that of a point light source can be provided.

Figure 7:
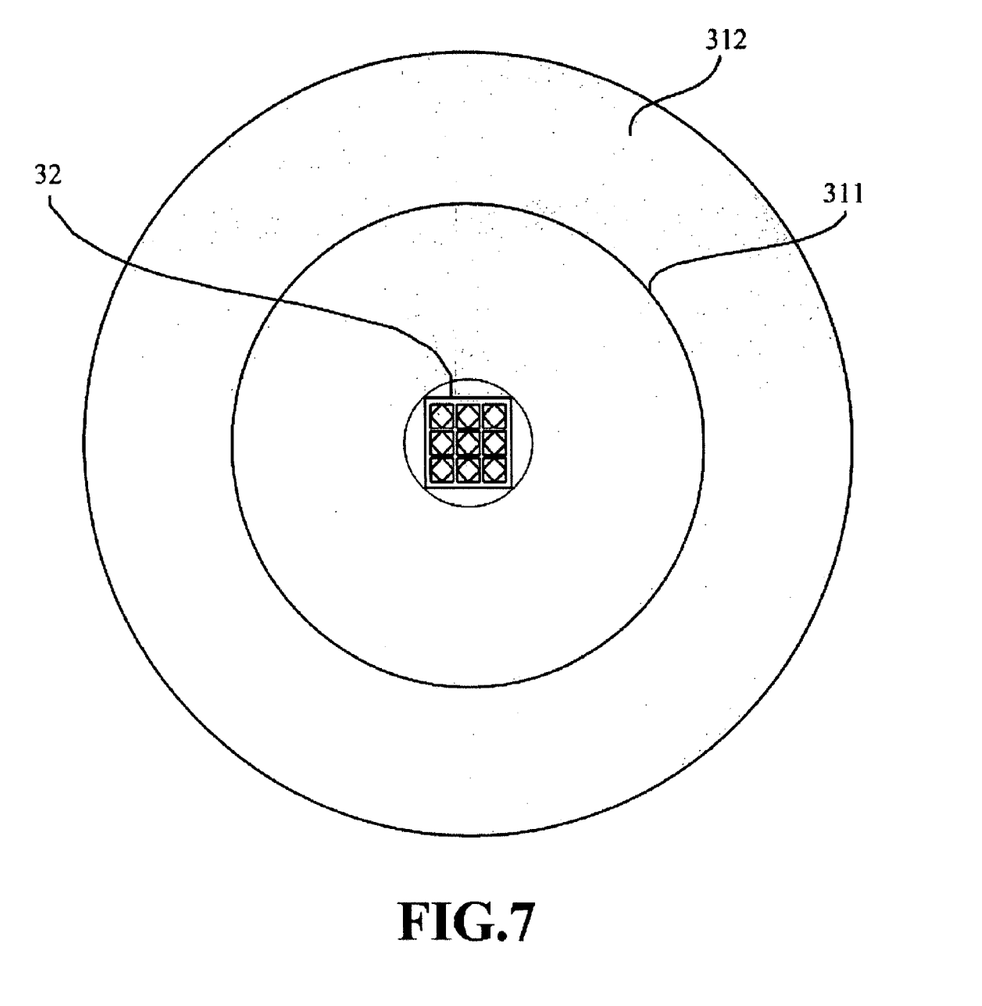
FIG. 7 through FIG. 10 shows several embodiments of the heat-dissipating fin.
Figure 8:
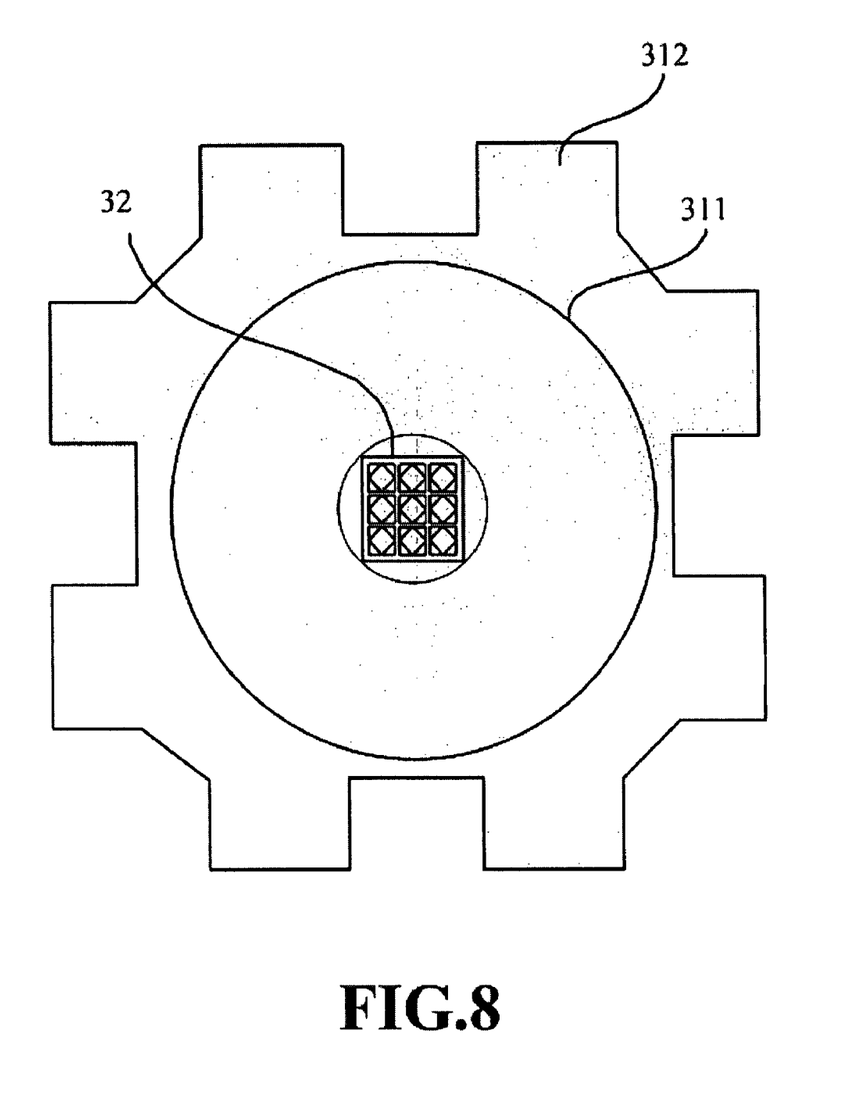
Figure 9:
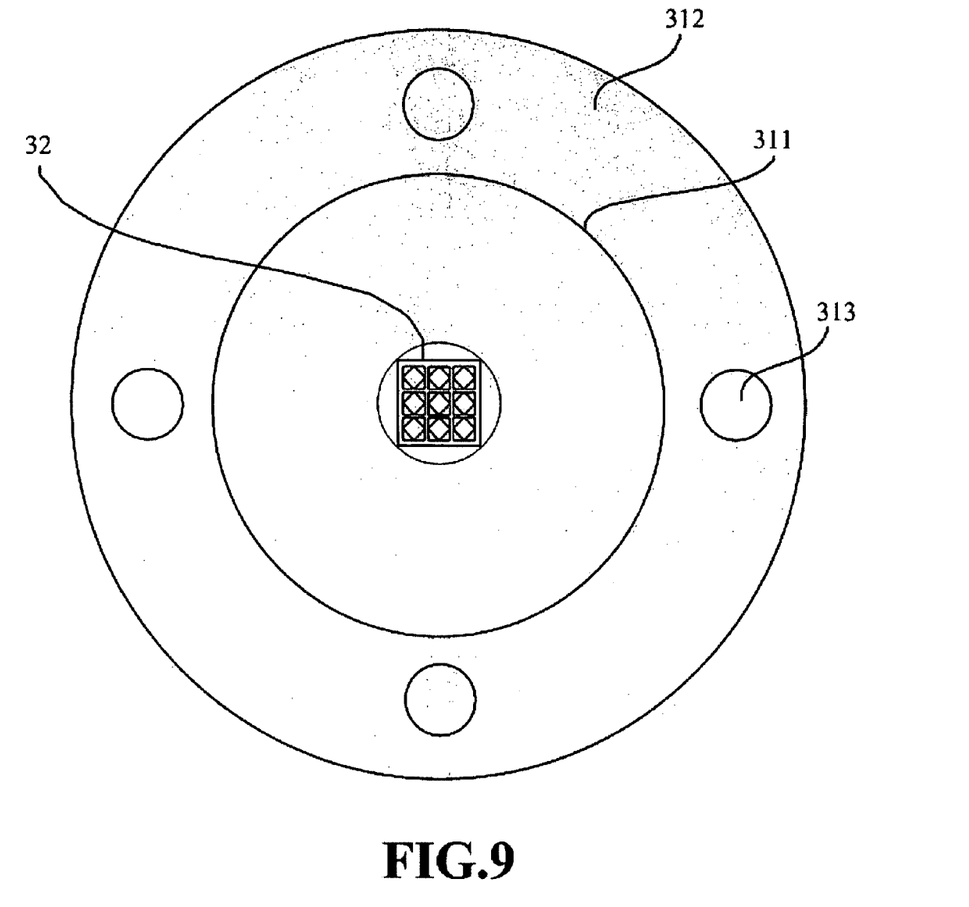
Figure 10:
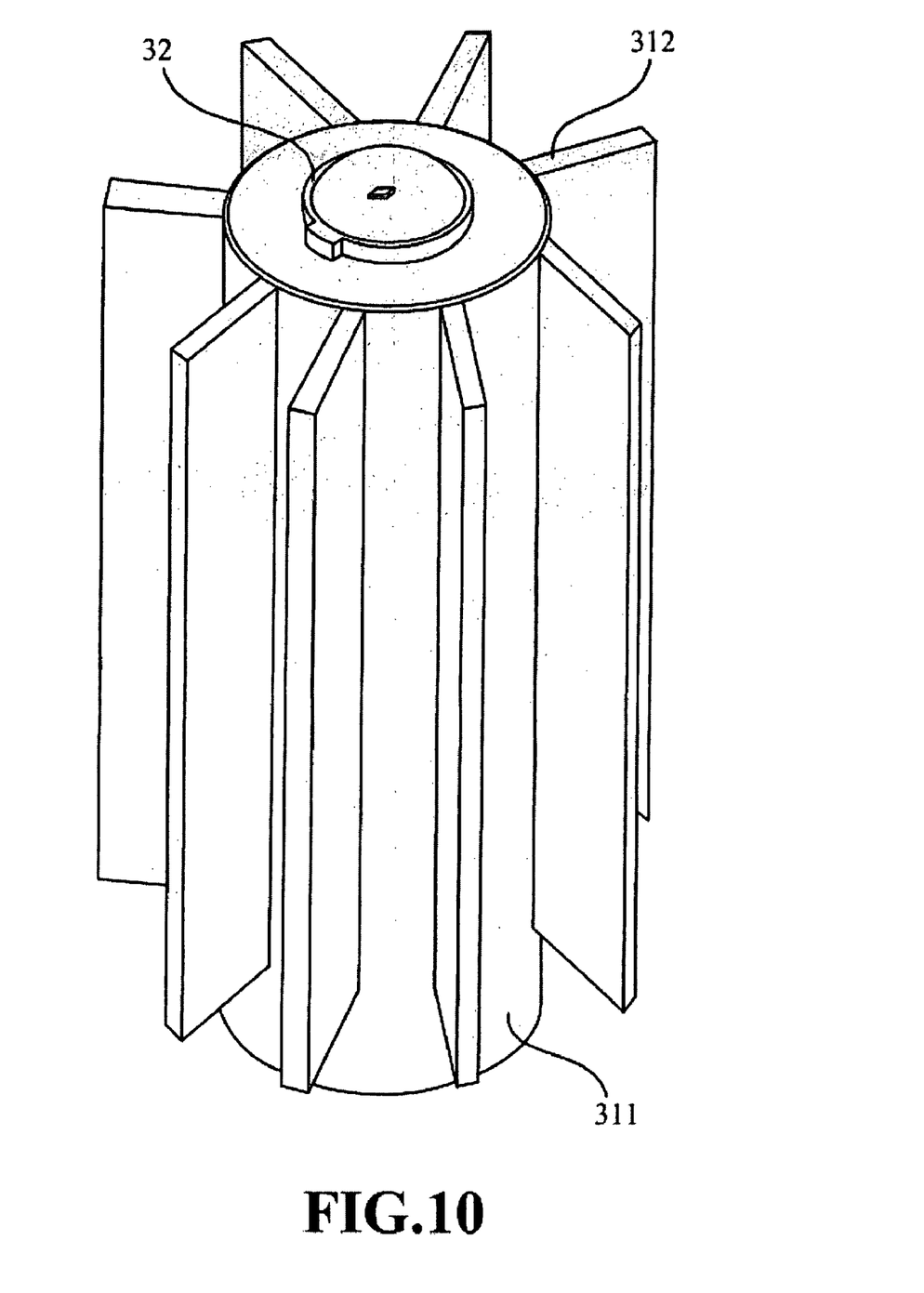

Please refer to FIG. 7 through FIG. 10. The heat-dissipating fin 312, according to this invention, can be implemented in various forms. Generally, the heat-dissipating fins 312 are mounted around the periphery of the heat-conducting device 311. The heat-dissipating fin 312 can be disk-like as shown in FIG. 7. As shown in FIG. 8, the heat-dissipating fin 312 can also be irregularly shaped, such as sawtooth-like, petal-like, or having holes as shown in FIG. 9. In FIG. 9, each heat-dissipating fin 312 thereon has formed-through holes 313. The holes 313 can let air circulate through, so as to accelerate heat-dissipating. FIG. 10 shows another embodiment of the heat-dissipating fin 312. The heat-dissipating fins 312 are perpendicular to the flat portion of the heat-conducting device 311 and surround the heat-conducting device 311.

Figure 11:
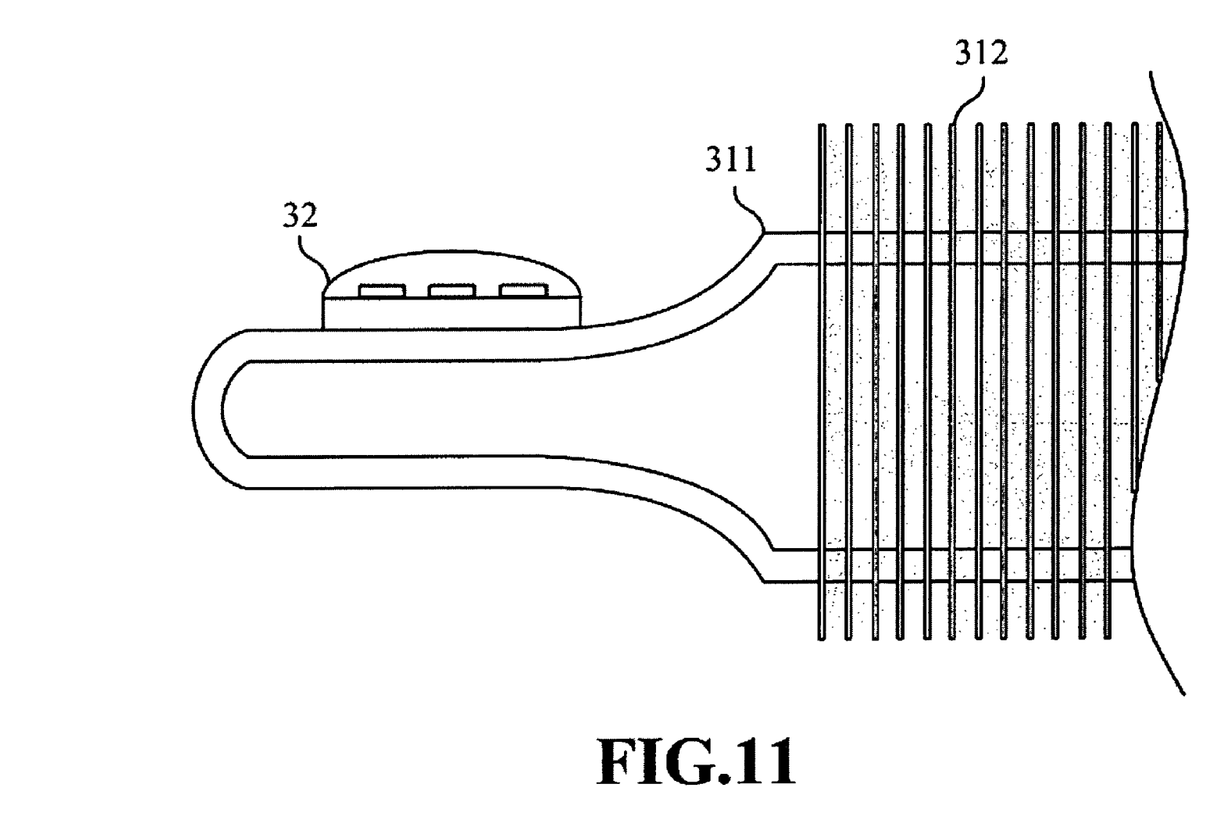
FIG. 11 illustrates another embodiment of the heat-conducting device and the LED light module.

Please refer to FIG. 11, which illustrates another embodiment of the heat-conducting device 311 and the LED light module 32. As shown in FIG. 11, one end of the heat-conducting device 311 is designed to be flat. The LED light module 32 can be disposed on the flat portion of the heat-conducting device 311.

Figure 12:
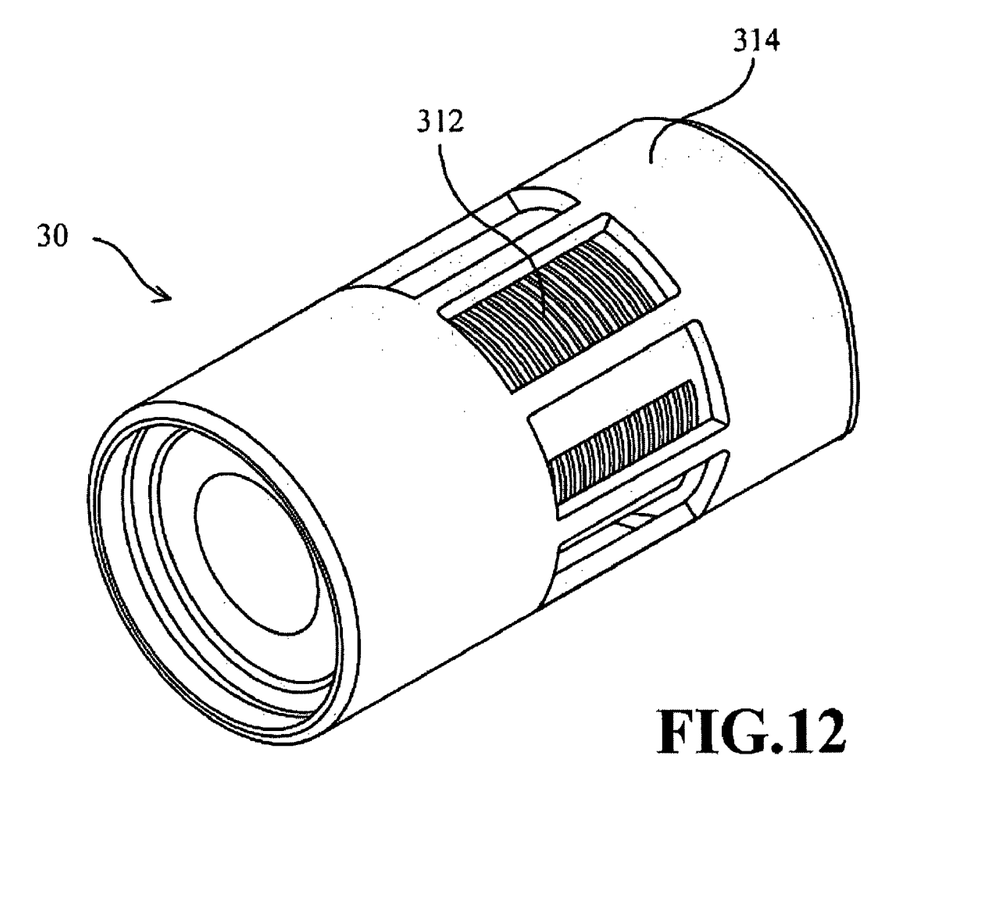
FIG. 12 through FIG. 14 shows several diode lamps with different casings according to this invention.

In actual applications, the diode lamp 30 can further include a casing 314. Please refer to FIG. 12, which illustrates an embodiment of the diode lamp 30 that includes a casing. The casing 314 is designed to cover the heat-dissipating fins 312 but not to affect the heat-dissipating function of the heat-dissipating fins 312. Besides, the casing 314 can be designed to be adapted to present cylindrical or rectangular batteries. Therefore, it is easy to integrate the diode lamp, according to this invention, with current power sources.

Figure 13:
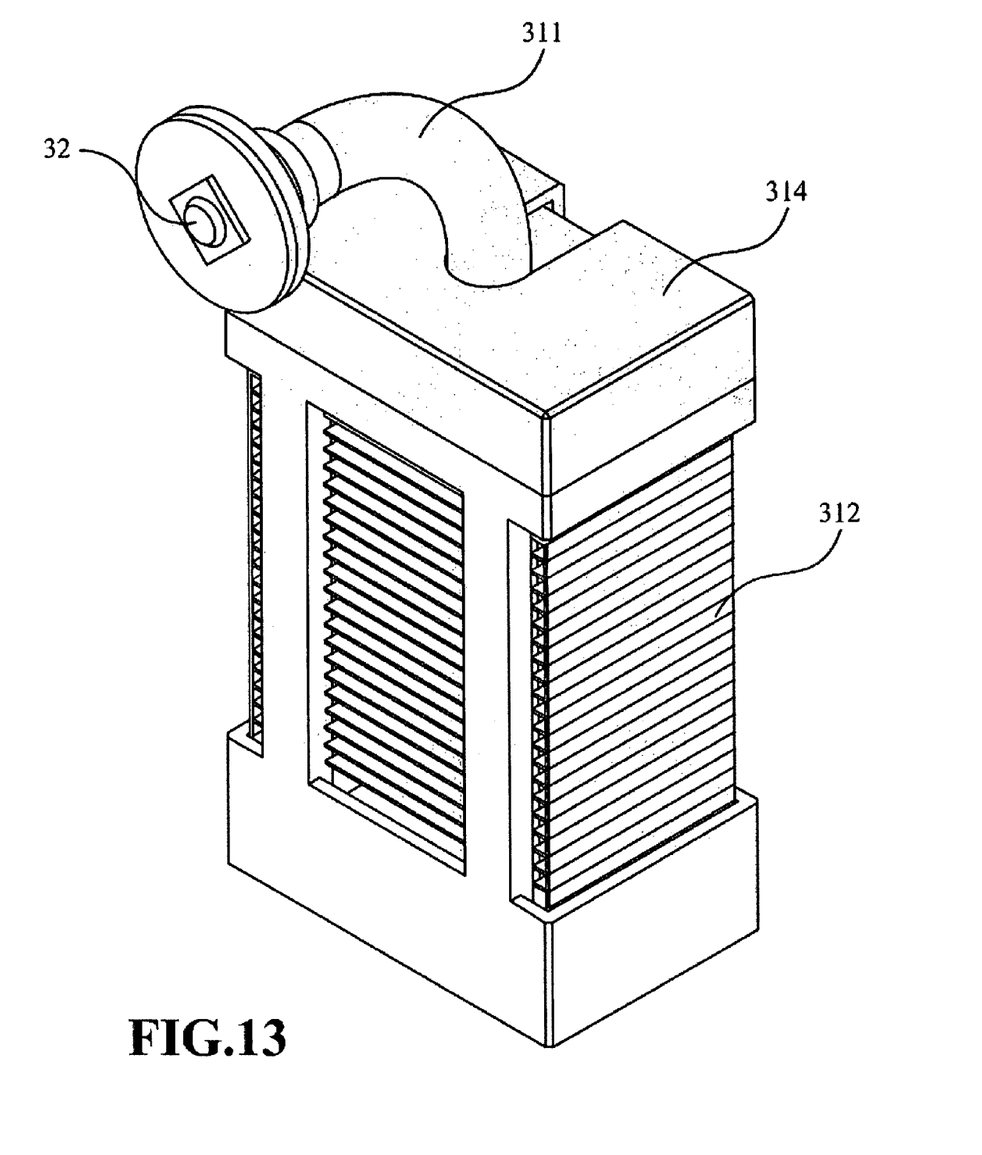

Please refer to FIG. 13, which illustrates a diode lamp in another preferred embodiment according to this invention. In this embodiment, the heat-conducting device 311 is a curved heat-conducting pipe. The LED light module 32 is disposed at a flat portion of one end of the heat-conducting device 311. The heat-dissipating fins 312 are mounted on the periphery of the heat-conducting device 311. Heat, generated by the LED light module 32, is conducted from the heat-conducting device 311 to the heat-dissipating fins 312 and is transmitted to surrounding air. In this way, heat-dissipating effect is achieved. The non-sealed casing 314 can be designed to cover the heat-dissipating fins 312 but not to affect the heat-dissipating function of the heat-dissipating fins 312.

Figure 14:
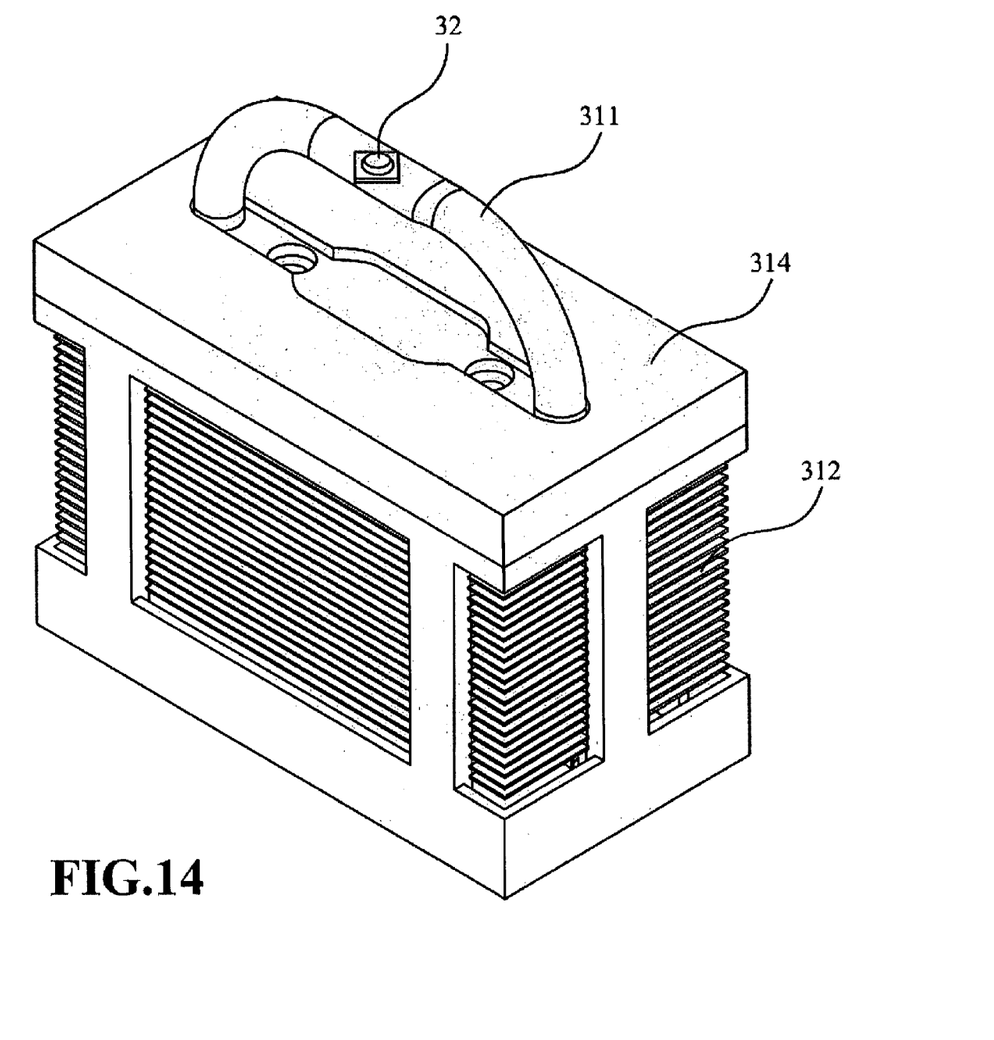

Please refer to FIG. 14, which illustrates a diode lamp in another preferred embodiment according to this invention. In this embodiment, the heat-conducting device 311 is also a curved heat-conducting pipe. The LED light module 32 is disposed at one flat portion on the side wall of the heat-conducting device 311. The heat-dissipating fins 312 are respectively disposed on the periphery of the two ends of the heat-conducting device 311. Heat, generated by the LED light module 32, is conducted from the heat-conducting device 311 to the heat-dissipating fins 312 and is transmitted to surrounding air.

Because the heat-conducting/heat-dissipating module is integrated with the LED light module in the diode lamp according to this invention, heat generated by the LED light module can be immediately dissipated to surrounding air by the heat-dissipating fins. Thus, heat-dissipating efficiency is greatly raised. Through improving the heat-dissipating efficiency of diode lamps, the problem that the efficiency of the LED is decreased by over-heating is solved in this invention. Accordingly, the lighting efficiency of the diode lamp in this invention can also be raised. Therefore, compared with prior arts, the diode lamp integrated with a heat-dissipating module, according to this invention, is more adaptive to lighting devices that require high power and highly efficient diode lamps.

With the above example and explanation, the features and spirits of the invention are hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A system-in-package, high power, and highly efficient diode lamp, comprising:
   a heat-conducting/heat-dissipating module, comprising:
   a heat-conducting device having a flat portion and a sidewall, the heat-conducting device being a heat-conducting pillar or a heat-conducting pipe, wherein the flat portion is disposed on an end of the heat-conducting device, and the flat portion has a flat surface oriented perpendicular to the connected sidewall; and
   at least one heat-dissipating fin mounted on the periphery of the heat-conducting device;
   a LED light module mounted on the flat portion of the heat-conducting device, wherein the light emitted by the LED light module is directed approximately along an extended direction of the heat-conducting device;
   an optical module for focusing light emitted by the LED light module; and
   a control circuit module for controlling the LED light module;
   wherein when the diode lamp is electrically connected to a power supply, the control circuit module selectively controls the LED light module to emit the light, and heat, generated during the operation of the LED light module, is conducted from the flat portion of the heat-conducting device to the at least one heat-dissipating fin and is dissipated by the at least one heat-dissipating fin.

2. The diode lamp of claim 1, wherein the power supply is an A.C. power source, and the control circuit module further comprises an AC-to-DC converter.

3. The diode lamp of claim 1, wherein the LED light module comprises:
   a substrate;
   a light-emitting module disposed on the substrate; and
   two electrodes respectively disposed on the substrate.

4. The diode lamp of claim 3, wherein the substrate is formed of a silicon material or a metal material.

5. The diode lamp of claim 1, wherein the LED light module comprises at least one LED or at least one laser diode.

6. The diode lamp of claim 1, wherein the LED light module comprises a white LED.

7. The diode lamp of claim 6, wherein the white LED comprises a blue LED and a phosphor.

8. The diode lamp of claim 1, wherein the LED light module comprises at least one red LED, at least one blue LED, and at least one green LED.

9. The diode lamp of claim 8, wherein the control circuit module selectively controls the at least one red LED, the at least one blue LED, and the at least one green LED to emit light.

10. The diode lamp of claim 1, wherein the LED light module comprises:
    a light-emitting module disposed on the flat portion of the heat-conducting device; and
    two electrodes respectively disposed on the flat portion of the heat-conducting device.

11. The diode lamp of claim 10, wherein a respective insulator is disposed between the heat-conducting device and each of the two electrodes.

12. The diode lamp of claim 1, wherein the heat-conducting device is formed of a copper material.

13. The diode lamp of claim 1, wherein each of the at least one heat-dissipating fin is mounted around the periphery of the heat-conducting device.

14. The diode lamp of claim 1, wherein each of the at least one heat-dissipating fin is disk-like.

15. The diode lamp of claim 1, wherein each of the at least one heat-dissipating fin is irregularly shaped.

16. The diode lamp of claim 1, wherein each of the at least one heat-dissipating fin thereon has at least one formed-through hole.

17. The diode lamp of claim 1, wherein the flat portion is formed at an end of the heat-conducting device.

18. The diode lamp of claim 1, wherein the flat portion is formed at a side wall of the heat-conducting device.

19. The diode lamp of claim 1, the diode lamp further comprising:
    a casing adapted to cover the at least one heat-dissipating fin.

* * * * *